US006492600B1

(12) United States Patent
Jimarez et al.

(10) Patent No.: US 6,492,600 B1
(45) Date of Patent: Dec. 10, 2002

(54) LAMINATE HAVING PLATED MICROVIA INTERCONNECTS AND METHOD FOR FORMING THE SAME

(75) Inventors: Miguel A. Jimarez, Newark Valley, NY (US); Ross W. Keesler, Owego, NY (US); Voya R. Markovich, Endwell, NY (US); Rajinder S. Rai, Johnson City, NY (US); Cheryl L. Tytran-Palomaki, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/340,758

(22) Filed: Jun. 28, 1999

(51) Int. Cl.[7] .............................. H05K 1/09; H05K 1/11; H05K 3/42

(52) U.S. Cl. ...................... 174/262; 174/256; 174/257; 174/258; 174/263; 174/264; 174/266; 257/698; 257/701; 257/702; 257/737; 257/774

(58) Field of Search ................................ 361/748, 767, 361/768, 783, 792, 795; 257/698, 700, 701, 702, 723, 737, 738, 773, 774, 778; 174/256, 258, 260, 262, 263, 264, 266; 428/209, 901

(56) References Cited

U.S. PATENT DOCUMENTS

| | | | | |
|---|---|---|---|---|
| 4,246,595 A | * | 1/1981 | Noyori et al. | 257/774 |
| 4,554,229 A | * | 11/1985 | Small, Jr. | 361/795 |
| 4,967,314 A | * | 10/1990 | Higgins, III | 361/792 |
| 5,047,114 A | * | 9/1991 | Frisch et al. | 216/17 |
| 5,269,880 A | * | 12/1993 | Jolly et al. | 257/774 |
| 5,277,929 A | | 1/1994 | Seki et al. | 427/97 |
| 5,326,671 A | * | 7/1994 | Brown et al. | 428/209 |
| 5,401,913 A | * | 3/1995 | Gerber et al. | 174/264 |
| 5,473,120 A | * | 12/1995 | Ito et al. | 174/264 |
| 5,509,557 A | | 4/1996 | Jimarez et al. | 216/95 |
| 5,557,844 A | * | 9/1996 | Bhatt et al. | 174/266 |
| 5,597,469 A | | 1/1997 | Carey et al. | 205/118 |
| 5,662,987 A | * | 9/1997 | Mizumoto et al. | 174/262 |

(List continued on next page.)

OTHER PUBLICATIONS

Electronic Materials and Processes Handbook, 2nd edition, Harper & Sampson, eds., McGraw–Hill, Inc., publ., 1994, section 9.2.5, pp. 9.10–9.11.*

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, May 1994.

Lawson et al., "Screen Stencils with Improved Release Properties," IBM Technical Diclosure Bulletin, vol. 37, No. 06A, pp. 441–442, Jun. 1994.

*Primary Examiner*—David L. Talbott
*Assistant Examiner*—John B. Vigushin
(74) *Attorney, Agent, or Firm*—Schmeiser, Olsen & Watts; Lawrence R. Fraley

(57) ABSTRACT

A chip carrier structure and method for forming the same having a receptor pad formed therein. The structure comprises a circuitized substrate having a conductive element on the surface, an External Dielectric Layer mounted on the circuitized substrate with an opening positioned above the conductive element to form a microvia. The walls of the microvia are first treated to enhance copper adhesion and then are electroplated to provide a receptor pad. Finally, a solder paste is deposited within the microvia to create a solder deposit or bump.

16 Claims, 4 Drawing Sheets

U.S. PATENT DOCUMENTS

| | | | |
|---|---|---|---|
| 5,685,070 A * | 11/1997 | Alpaugh et al. | 361/792 |
| 5,758,413 A * | 6/1998 | Chong et al. | 174/266 |
| 5,798,563 A * | 8/1998 | Feilchenfeld et al. | 257/698 |
| 5,847,327 A * | 12/1998 | Fischer et al. | 174/258 |
| 5,958,600 A * | 9/1999 | Sotokawa et al. | 428/209 |
| 6,002,172 A * | 12/1999 | Desai et al. | 257/737 |
| 6,005,198 A * | 12/1999 | Gregoire | 174/262 |
| 6,046,909 A * | 4/2000 | Joy | 257/774 |
| 6,052,287 A * | 4/2000 | Palmer et al. | 361/767 |
| 6,115,911 A * | 9/2000 | Liaw | 174/262 |
| 6,127,633 A * | 10/2000 | Kinoshita | 174/259 |
| 6,127,726 A * | 10/2000 | Bright et al. | 257/723 |
| 6,143,401 A * | 11/2000 | Fischer et al. | 257/702 |
| 6,178,093 B1 * | 1/2001 | Bhatt et al. | 361/795 |
| 6,184,589 B1 * | 2/2001 | Budnaitis et al. | 257/700 |
| 6,204,456 B1 * | 3/2001 | Lauffer et al. | 174/262 |
| 6,228,511 B1 * | 5/2001 | Sachdev et al. | 438/626 |
| 6,251,502 B1 * | 6/2001 | Yasue et al. | 428/209 |
| 6,261,946 B1 * | 7/2001 | Iacoponi et al. | 257/774 |
| 6,326,555 B1 * | 12/2001 | McCormack et al. | 174/262 |
| 6,420,018 B1 * | 7/2002 | Inoue et al. | 361/748 |

* cited by examiner

LAMINATE HAVING PLATED MICROVIA INTERCONNECTS AND METHOD FOR FORMING THE SAME

BACKGROUND OF THE INVENTION

1. Technical Field

The present invention relates to interconnect structures, and more specifically relates to a receptor pad for use in a chip carrier package.

2. Prior Art

Forming electrical connections between components remains an ongoing challenge in the electronics industry. As sizes decrease, more precision and smaller interconnections are required when attaching components to circuit boards, planar surfaces, substrates, and the like (collectively referred to herein as "landing areas"). While soldering techniques are widely available to connect components, the ability to provide landing areas with small and reliable receptor pads becomes increasingly difficult.

One particular application that utilizes high density interconnections involves integrated circuit (IC) chip packaging. An IC chip package comprises a relatively small IC device encapsulated in a larger package, which is more suitable for use in the industry. The "larger" IC chip package includes external connectors (e.g., a ball grid array) suitable for electrical communication with a traditional circuit board. Conversely, the smaller IC device, which comprises much smaller connectors, resides within the IC chip package on a landing area or laminate. Thus, the IC chip package must provide a relatively small landing area as well as a system for internally routing signals between external package connectors and internal IC device connectors.

In order to achieve this redirection of signals, a landing area comprised of a circuitized substrate or laminate is provided having a set of internal (high density) receptor pads. Circuit lines within the substrate route the signals from external connectors, which are in communication with external devices, to the receptor pads on a landing area, which connect with the IC device. Connection between the landing area and IC device is generally achieved by soldering. Solder techniques are well known in the art and examples are found in U.S. Pat. No. 5,597,469 issued on Jan. 28, 1997 to Carey et al., and assigned to International Business Machines.

As noted, given the trend towards smaller IC devices, the circuitized substrate must provide a high number of receptor pads in a very small surface area. This is becoming more difficult to achieve with present design techniques. Specifically, because solder cannot wet down onto non-metal and/or organic materials, receptor pads must be designed with an adequate metal surface to ensure attachment. If such a surface is not provided, solder often fails to properly wet the pads and becomes inadvertently removed from the pad during subsequent reflow and wash processes. The most common pad structure to ensure adequate metal surface comprises a "dog bone" structure that utilizes a flat pad attached to an adjacent via. Unfortunately, these structures take up a lot of surface area.

Thus, a need exists to provide a receptor pad that can reliably receive solder without requiring an extensive amount of surface area. All of the aforementioned references are hereby incorporated by reference.

SUMMARY OF THE INVENTION

The present invention provides a method for forming a receptor pad on a laminate, comprising the steps of: providing a circuitized substrate that includes a surface having a conductive element; mounting an external dielectric layer (EDL) on the surface; forming an opening in the EDL to expose the conductive element and create a microvia; treating an interior side wall surface of the microvia to promote copper adhesion; and electroplating the microvia with copper.

Once the microvia is electroplated, a resist process is used to define and finalize the receptor pad. Thereafter, a wet solder paste may be deposited on the receptor pads followed by a reflowing and washing step to create a reliable solder bump.

The invention also comprises a laminate having a receptor pad formed thereon, comprising: a circuitized substrate having a conductive element on a surface; an EDL mounted on the circuitized substrate, the EDL having an opening positioned above the conductive element to form a microvia; and an electroplated layer deposited within the microvia.

It is therefore an advantage of the present invention to provide a microvia structure that can be used as a receptor pad and directly receive a solder deposit.

It is therefore a further advantage of the present invention to provide higher density surface mounting technology by eliminating the need for dog bones and the like.

It is therefore a further advantage of the present invention to provide a microvia that allows solder to reliably wet thereon.

BRIEF DESCRIPTION OF THE DRAWINGS

The purpose of the foregoing and other aspects and advantages will be better understood from the following detailed description of the invention with reference to the drawings, in which.

DETAILED DESCRIPTION OF THE INVENTION

Figure 1:
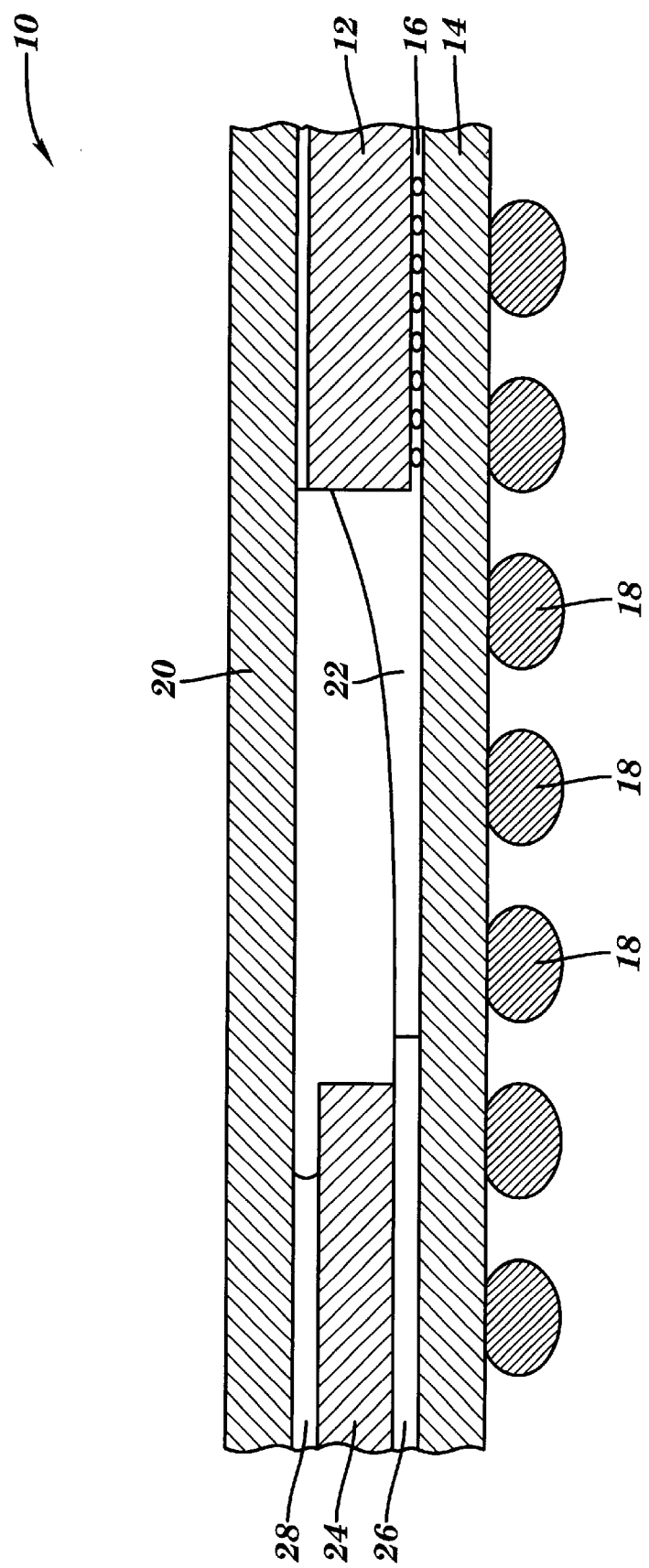
FIG. 1 depicts a cross-section of a IC chip package in accordance with a preferred embodiment of the present invention.

Referring to figures, FIG. 1 depicts a cross-section of a integrated circuit chip package 10. The integrated circuit chip package 10 includes a chip 12, a laminate 14, connections 16 that interconnect the laminate 14 with the chip 12, a cover plate 20, a stiffener 24, adhesives 26 and 28, an encapsulation material 22, and a ball grid array (BGA) structure 18. While this preferred embodiment deals generally with the electrical interconnect between laminate 14 and chip 12 within a chip package, it is understood that the structure and methods described herein could be used on any planarized surface that provides component interconnections. Moreover, the figures are provided primarily for explanation purposes, and are not necessarily drawn to scale.

Figure 2:
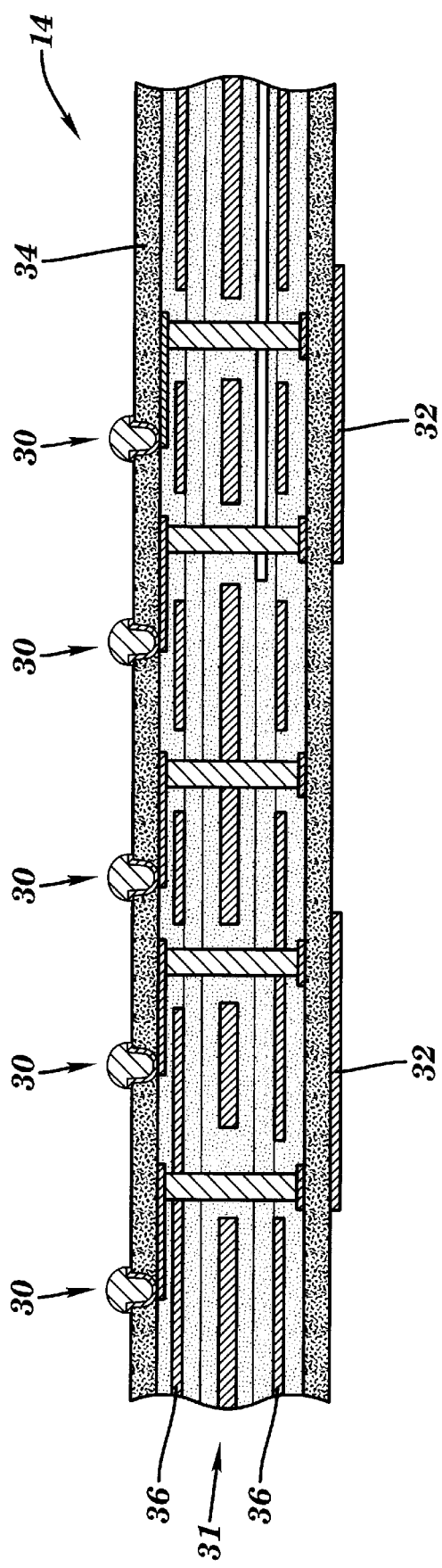
FIG. 2 depicts a cross-section of a laminate in accordance with a preferred embodiment of the present invention.

Referring now to FIG. 2, the laminate 14 is depicted in detail, and includes receptor pads 30 on a top surface, BGA pads 32 on a bottom surface, a circuitized substrate 31, and an external dielectric layer (EDL) 34 mounted on the top surface of the circuitized substrate 31. EDL 34 may comprise a solder mask, a redistribution build-up layer, or any dielectric material that can insulate the top of the circuitized substrate 31 and include an adequate thickness for the purposes described herein. The circuitized substrate 31 comprises circuits 36 (e.g., voltage planes, ground planes, signal planes, vias, etc.) that electrically redirect electrical signals from BGA pads 32 to receptor pads 30. Accordingly, in addition to providing a "landing area" for the IC device, laminate 14 includes a multilayer structure that provides an electrical transition between relatively small receptor pads 30 (to handle the IC device) and relatively large BGA pads 32 (for surface mount connections).

Figure 3:
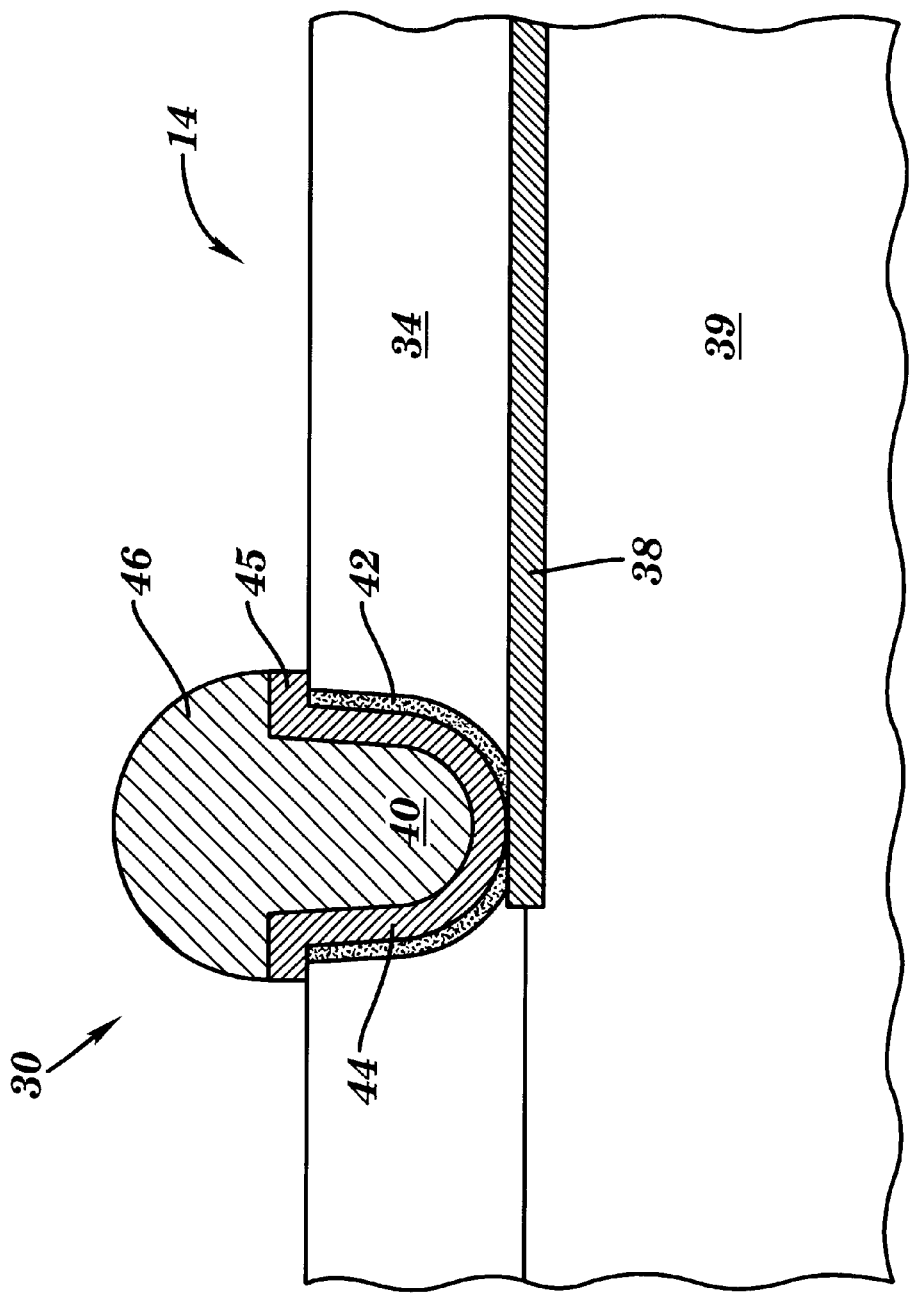
FIG. 3 depicts a cross-section of a receptor pad in accordance with a preferred embodiment of the present invention.

Referring now to FIG. 3, a cross-sectional side view of a receptor pad 30 in accordance with this invention is depicted. The receptor pad 30 is formed in laminate 14, which includes a EDL 34 and a circuitized substrate 39. EDL 34, which provides an insulative surface on the laminate 14, may be comprised of any dielectric material, such as epoxy, plastic, etc. The dielectric material may comprise an organic make-up. The EDL 34 may be affixed/created with any known method, such as with a "spray-on" application, liquid screening, attachable film, etc. While the preferred thickness will be on the order of 2 mils, the resulting EDL can be any desired thickness. In the EDL 34 is an opening 40 having side wall surfaces 42. The side walls can be oriented in a generally perpendicular fashion, or angled. Openings 40 can be created using any technique, including laser ablating, plasma etching, and photoimaging. On the surface of the circuitized substrate 39, below the EDL 34, is conductive element 38. Conductive element 38 is one of many conductors residing within the circuitized substrate 39, and could be any type of electrical conductor, such as a wire, signal plane, voltage/ground plane, via, etc. The receptor pad 30 is comprised of a microvia formed within an opening 40 in the EDL 34. The microvia includes an electroplated layer 44 of copper that is in contact with conductive element 38. While the electroplated layer 44 is shown as only a layer within the microvia, the layer 44 could fill the entire microvia structure. Copper plating of the microvias could also be achieved by using an electroless copper plating process, as opposed to electroplating. Alternatively, the microvia structure could be filled with an additional conductive material, such as conductive paste, silver, copper, etc. The electroplated layer 44 further comprises a lip 45 that overlaps the surface of the EDL 34. The receptor pad 30 is designed to receive a solder deposit or bump 46, that extends above the EDL.

Because a solder deposit or bump 46 (supplied during subsequent reflow processes) will not reliably wet (i.e., remain attached) directly to the interior side walls of the EDL 34 opening, this invention utilizes a metallically plated microvia to provide a surface that will reliably receive and maintain solder bump 46. Without the plating, solder will not reliably flow over and adhere to the EDL walls, particularly if the EDL is comprised of an organic material. However, similar to the solder bump, a reliable system for attaching the electroplated layer 44 to the interior surface of the EDL 34 opening must likewise be implemented. Accordingly, the present invention provides a treated interior side wall surface 42 that is used to ensure adhesion of the plating 44. For the preferred embodiment, the interior side wall surface 42 is treated in any known manner that will promote copper adhesion. For example, the interior wall 42 may include a surface that is "roughened" to enhance the adhesion of the electroplating 44 to the EDL 34. Roughening may be achieved with, for example, a mechanical or a chemical process such as mechanical scrubbing, epoxy etching or plasma sanding.

Figure 4:
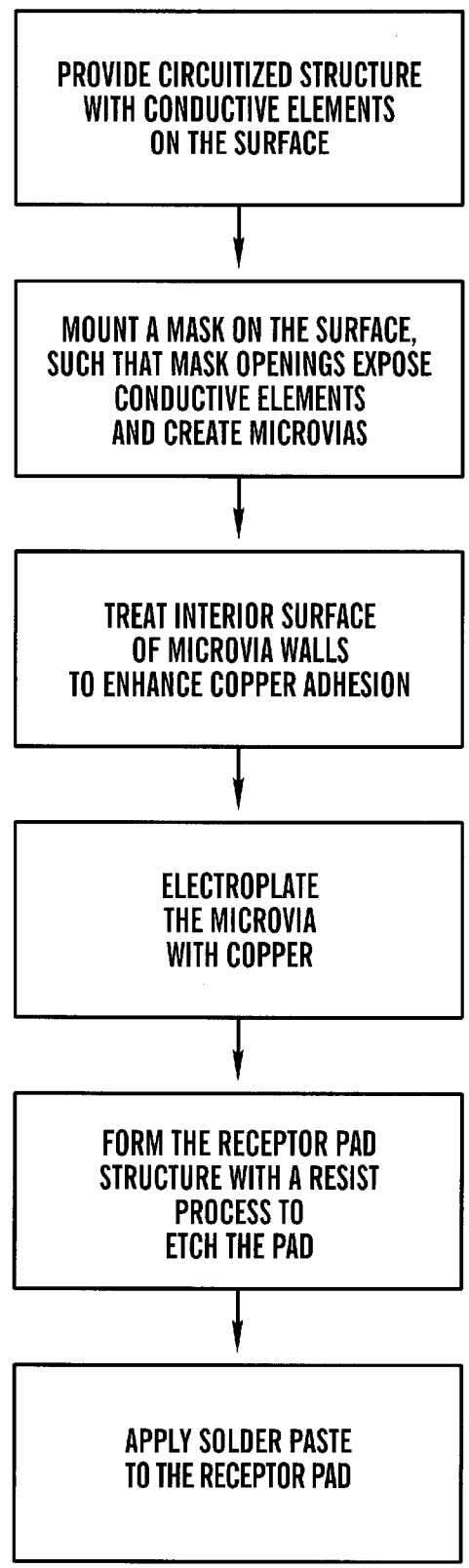
FIG. 4 depicts a flow/chart of a method of fabricating a receptor pad in accordance with a preferred embodiment of the present invention.

Referring now to FIG. 4, a flow chart describing the method for fabricating the receptor pads 30 and solder bump 46 is described. First, a circuitized substrate 39 with conductive elements on the surface is provided. Next, a EDL 34 is mounted on the surface of the circuitized structure 39 such that EDL openings expose the desired conductive elements and create microvias. Next, the interior side wall surfaces of the microvias are treated to enhance copper adhesion. The treatment may include, for example, any of the roughening methods described above.

Next, the interior surfaces of the microvias are electroplated with copper. This may be achieved with a multi-step "plate-up" process that includes the application of a copper seed layer, followed by a full plating operation. The application of the seed layer may be accomplished with an electroless strike process that applies copper seeding to the treated side wall surfaces. Full panel electroplating with acid copper can then be used to finish the plating. This plating process may be accomplished with a bath process utilizing dip tanks, or any other known plating methods. As noted above, an electroless plating methodology could likewise be used. The result is a microvia (as well as the laminate surface) lined with metal plating. While the thickness of the plating may vary depending upon the particular application, this preferred embodiment contemplates a thickness of about 1 mil on the side walls and 0.7 mils on the bottom. Alternatively, the microvia could be filled with a conductive material as described above. Finally, the structure of the receptor pads are formed and finalized with a resist process to etch the pad. This process creates discrete pads on the laminate surface and eliminates copper from the laminate surface where it is not desired. Any known photo resist process to define the pads may be used, including the plate up and etch method described, or by using an additive or semi-additive pattern plating process using electroless copper plating. Because the resultant microvia sidewalls have metal rather than bare epoxy, solder paste can wet down to the pad eliminating unreliable connections.

Once the pad is complete, a solder paste may be applied to the receptor pads to provide solder bumps. One method for applying solder paste to the receptor pads involves a "flip chip" screen printing process. This process utilizes a solder screen printer, which is an automated tool used to deposit wet solder paste onto a card or any fine pitch, micro BGA, or chip carrier site. The screen printer utilizes a framed metal mask (stencil) with apertures in the same pattern array as the carrier. Typical BGA stencils are 8 mils thick with 30 mil diameter apertures. For this preferred embodiment, a 2 mil thick stencil with a 5–6 mil diameter aperture may be used.

The screen printer may utilize a high magnification vision system to align up the carrier with the stencil. After alignment is complete, a camera moves to the side and the carrier is automatically pushed up to the stencil thereby aligning the pads on the carrier to the stencil. Solder paste is applied to the stencil and squeegee blades or a printing head comes down in contact with the stencil, sweeping across, and depositing the wet solder onto the carrier. The carrier comes down away and out from the stencil and is removed. This process may be repeated multiple times. The carrier may then reflowed and washed and a visual inspection may be performed to inspect for missing bumps. Because the microvias are plated up (approximately 0.7 mils thickness in the bottom of the well), the result is a relatively small gap between the top of the receptor pad and the screened solder paste, which provides higher reliability.

While this invention has been described in conjunction with the specific embodiments outlined above, it is evident that many alternatives, modifications and variations will be apparent to those skilled in the art. Accordingly, the preferred embodiments of the invention set forth above are intended to be illustrative, not limiting. Various changes may be made without departing from the spirit and scope of the invention as defined in the following claims.

What is claimed is:

1. A chip carrier structure having a receptor pad formed thereon, comprising:
    a circuitized laminate having a conductive element on a surface;
    an external dielectric layer (EDL) mounted on the circuitized laminate, the EDL having an opening positioned above the conductive element, the opening having interior side walls treated for conductive adhesion;
    a plated layer deposited on the treated interior side walls; and
    a conductive non-polymeric material operatively attached at least partially within the opening to the plated layer.

2. The chip carrier of claim 1, wherein the plated layer is electroplated.

3. The chip carrier of claim 1, wherein the plated layer is electrolessly plated.

4. The chip carrier of claim 1, wherein the plated layer comprises acid copper.

5. The chip carrier of claim 1, wherein the conductive material, in contact with the plated layer, fills the opening.

6. The chip carrier of claim 1, wherein the plated layer overlaps a top surface of the EDL.

7. A chip carrier structure having a receptor pad formed thereon, comprising:
    a circuitized laminate having a conductive element on a surface;
    an external dielectric layer (EDL) mounted on the circuitized laminate, the EDL having an opening positioned above the conductive element, the opening having interior side walls treated for copper adhesion;
    a plated layer deposited on the treated interior side walls; and
    a conductive material operatively attached at least partially within the opening to the plated layer wherein the conductive material is a solder paste deposit.

8. An integrated circuit chip package, comprising:
    a coverplate;
    a stiffener;
    a chip having a plurality of contacts;
    a laminate having a plurality of receptor pads electrically connected to the chip contacts, the laminate having:
        a circuitized substrate having conductive elements on a surface;
        an external dielectric layer (EDL) mounted on the circuitized substrate, the EDL having openings positioned above each of the conductive elements forming a plurality of microvias;
        a plated layer of copper deposited in each microvia; and
        a conductive non-polymeric material operatively attached at least partially within the microvia to the plated layer to form said plurality of receptor pads.

9. The integrated circuit chip package of claim 8, wherein the plated layer is electroplated.

10. The integrated circuit chip package of claim 8, wherein the plated layer is electroless plating.

11. The integrated circuit chip package of claim 8, wherein the plated layer substantially fills the microvia.

12. The integrated circuit chip package of claim 8, wherein the conductive material fills the microvia.

13. The integrated circuit chip package of claim 8, wherein the plated layer of copper overlaps a top surface of the EDL.

14. The integrated circuit chip package of claim 8, wherein each opening in the EDL comprises interior wall surfaces treated for copper adhesion.

15. The integrated circuit chip package of claim 8, wherein each opening in the EDL comprises interior wall surfaces that are angled.

16. An integrated circuit chip package, comprising:
    a coverplate;
    a stiffener;
    a chip having a plurality of contacts;
    a laminate having a plurality of receptor pads electrically connected to the chip contacts, the laminate having:
        a circuitized substrate having conductive elements on a surface;
        an external dielectric layer (EDL) mounted on the circuitized substrate, the EDL having openings positioned above each of the conductive elements forming a plurality of microvias;
        a plated layer of copper deposited in each microvia; and
        a conductive material operatively attached at least partially within the microvia to the plated layer to form said plurality of receptor pads, wherein the conductive material is a solder connection.

* * * * *